United States Patent
Bruland

(10) Patent No.: US 10,830,586 B1
(45) Date of Patent: Nov. 10, 2020

(54) CONFOCAL CHROMATIC SENSOR SYSTEMS

(71) Applicant: FEI Company, Hillsboro, OR (US)

(72) Inventor: Kelly Bruland, Hillsboro, OR (US)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/445,974

(22) Filed: Jun. 19, 2019

(51) Int. Cl.
*G01C 3/08* (2006.01)
*H01J 37/20* (2006.01)
*H01J 37/26* (2006.01)

(52) U.S. Cl.
CPC .............. *G01C 3/08* (2013.01); *H01J 37/20* (2013.01); *H01J 37/26* (2013.01); *H01J 2237/20214* (2013.01); *H01J 2237/24578* (2013.01)

(58) Field of Classification Search
USPC .......................................... 250/306, 307, 310
See application file for complete search history.

(56) References Cited

U.S. PATENT DOCUMENTS

| | | | | |
|---|---|---|---|---|
| 5,785,651 A | * | 7/1998 | Kuhn ................... | G01B 11/026 250/339.06 |
| 2012/0235036 A1 | * | 9/2012 | Hatakeyama ......... | H01J 37/073 250/310 |
| 2016/0377412 A1 | * | 12/2016 | Li ........................ | G01N 21/956 356/630 |
| 2018/0113027 A1 | * | 4/2018 | Kubo ................... | G01B 11/245 |

* cited by examiner

*Primary Examiner* — Kiet T Nguyen

(57) ABSTRACT

Confocal chromatic sensor systems for determining position of a sample include a beam emitter that emits a multichromatic beam incident on a surface of a sample, and a beam detector that is separate from the beam emitter and which detects a portion of the multichromatic beam reflected by the surface. The beam emitter is configured such that light of different wavelengths within the multichromatic beam have different corresponding focal lengths. The systems can include a memory storing computer readable instructions that cause a processing unit to determine which wavelength (s) are most prevalent in the detected portion of the multichromatic beam, and then determine the distance between the surface and the beam emitter based on the wavelength(s). When the surface is a sample within a charged particle beam system, a focus of the charged particle beam system or a sample position may be adjusted based on the position of the sample.

20 Claims, 11 Drawing Sheets

CONFOCAL CHROMATIC SENSOR SYSTEMS

BACKGROUND OF THE INVENTION

Confocal chromatic height sensors use light to determine displacement, distance, position, and/or thickness. Generally, such sensors use a white light source that is focused through a lens with a high degree of chromatic aberration. This causes portions of the white light to have different focal lengths depending on their corresponding wavelengths. For example, red light will be focused at one distance and blue light will be focused at a different distance. Based on the peak wavelength(s) and/or the distribution of the spectrum of the light reflected back from a surface and through the lens, the confocal chromatic height sensors are able to determine a precise distance measurement. For example, if the light reflected back from the surface and through the lens contains a large amount of light of a certain wavelength, the confocal chromatic height sensor can determine that the surface is located at the focal distance for that certain wavelength.

For example, FIG. 1 illustrates a prior art confocal chromatic sensor 100. The prior art confocal chromatic sensor 100 includes a light source 102 that generates white light 104, which is directed onto one or more lenses 106 having a high degree of aberration via an optical fiber 108. Because the one or more lenses 106 have a high degree of aberration, they focus different wavelength components 110 of the white light 104 at different focal lengths. For example, FIG. 1 illustrates λ min, λ1, and λ max being focused at three different focal lengths along a central axis 112 of the one or more lenses 106.

In FIG. 1, the focal point of λ1 114 is shown to correspond to the surface of a sample 116 located on a sample holder 118. The wavelength of light that is focused upon the surface of the sample produces the largest reflection back into the lenses 106. The light reflected back into the lenses 106 is then provided to a detector 120 that determines the peak wavelength that is present in the reflected light. FIG. 1 shows the reflected light being provided to the detector 120 via optical fiber 108, a coupler 122, and an additional optical fiber 124. For example, FIG. 1 includes a graph 126 that shows the wavelengths present in the reflected light. Graph 126 shows that the peak wavelength 128 corresponds to λ1. Once the peak wavelength present in the reflected light is determined, the confocal chromatic sensor 100 can determine the distance between the lenses 106 and the surface of the sample 116. Specifically, the confocal chromatic sensor 100 can determine that the distance between the lenses 106 and the surface of the sample 116 is equal to the focal length of the peak wavelength in the reflected light. However, prior art commercial confocal chromatic sensors require the lenses 106 to have a high numeric aperture in order to accept light reflected at an angle from the surface. This requires a large diameter lens and a short focal distance, which is not easily accommodated in many system environments.

SUMMARY OF THE INVENTION

Confocal chromatic sensor systems for determining relative position of a sample include a beam emitter that emits a multichromatic beam so that is incident on a surface of a sample, and a beam detector that is separate from the beam emitter and which detects a portion of the multichromatic beam that is reflected by the surface. The beam emitter is specially configured such that light of different wavelengths within the multichromatic beam have different corresponding focal lengths. The systems can further include a processing unit and a memory storing computer readable instructions that, when executed on the processing unit cause the processing unit to determine which wavelength(s) are most prevalent in the detected portion of the multichromatic beam, and then determine the distance between the surface and the beam emitter based on the wavelength(s). In some systems, the surface may be a portion of a sample within a charged particle beam system, and the instructions may cause the processing unit to determine the relative position of the sample within the charged particle beam system.

Methods for determining the relative position of a sample in a charged particle device according to the present disclosure include emitting a multichromatic beam to be incident on a surface of the sample by a beam emitter, and detecting a portion of the multichromatic beam that is reflected by the surface of the sample by a beam detector separate from the beam emitter. Because the light of different wavelengths within the multichromatic beam have different corresponding focal lengths, the system is able to determine the wavelength(s) having a highest prevalence in the portion of the multichromatic beam, and then determine the relative position of the sample in the charged particle device based on the wavelength(s).

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
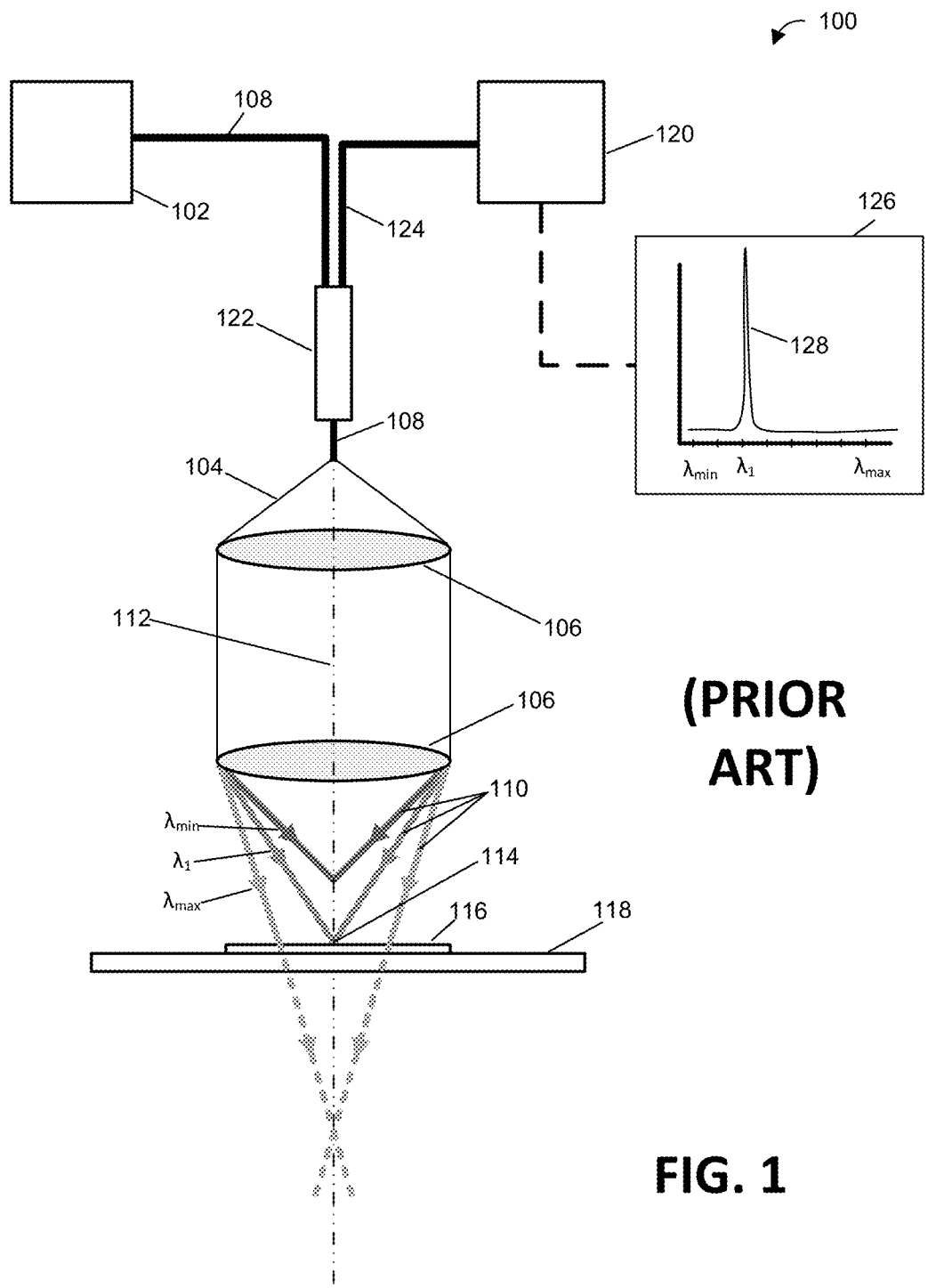
FIG. 1 illustrates a prior art confocal chromatic sensor.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Variable current multi-beam charged particle devices and system for inspection of a sample are disclosed. More specifically, the disclosure includes devices and systems that provide multi-beam charged particle functionality while also allowing the current of the multi-beam beamlets to be selectively varied, allow users to toggle between a single beam mode of operation and a multi-beam mode of operation, correct for aberration in the multi-beam beamlets, or a combination thereof. Additionally, the devices and systems described in the present disclosure can be implemented using current single beam charge particle systems/technology, potentially reducing the cost of the disclosed variable multi-beam charged particle system. This enables multi-beam functionality to be obtained by a greater number of scientists, potentially significantly increasing the speed of future scientific innovation.

Figure 2:
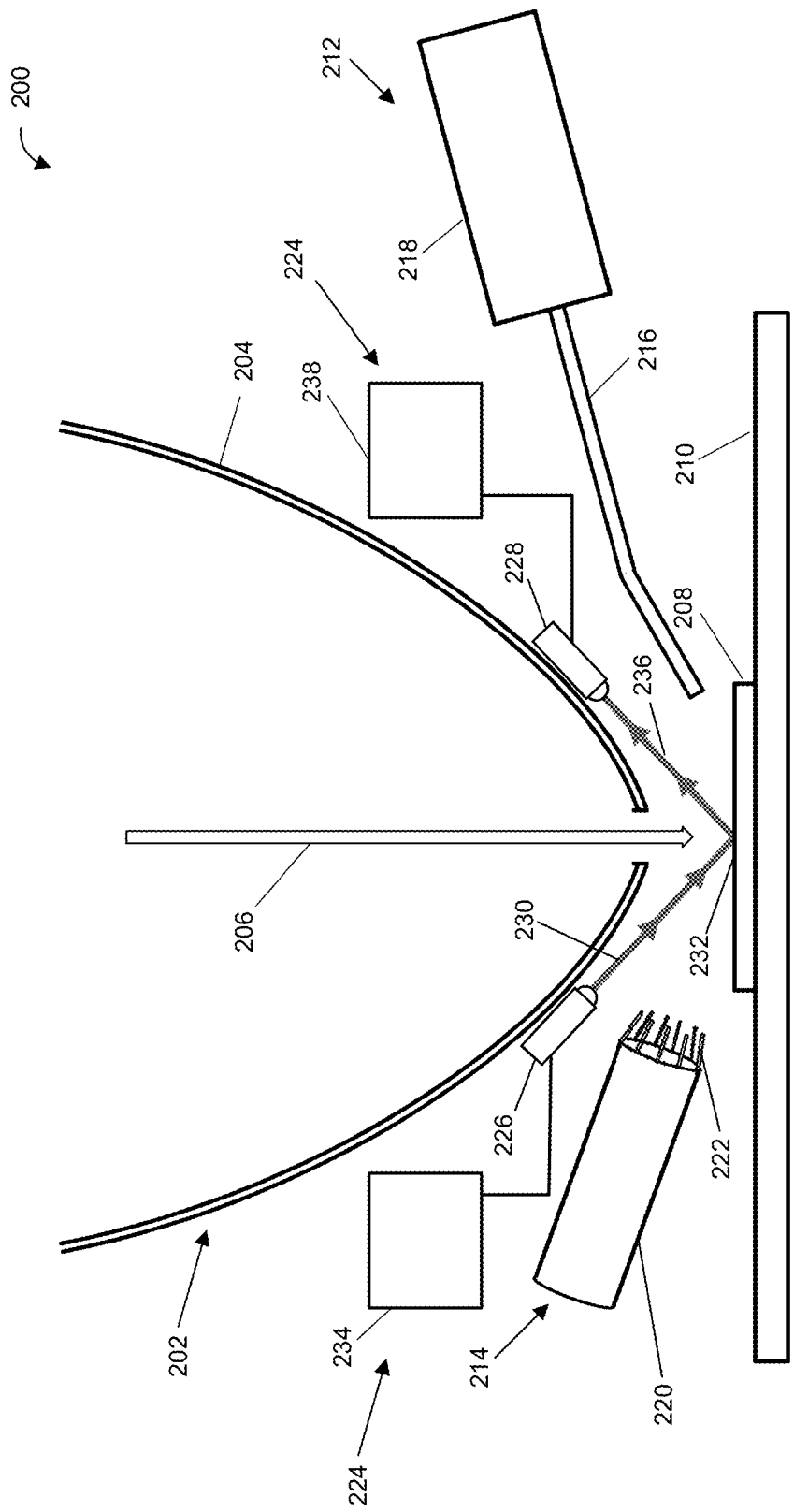
FIG. 2 illustrates example charged particle beam systems that include an example confocal chromatic sensor system.

FIG. 2 is an illustration of example charged particle beam system(s) 200 that include an example confocal chromatic sensor system. In various embodiments, the example charged particle beam system(s) 200 may include electron microscope (EM) setups and/or other charged particle microscope setups. For example, the example charged particle beam system(s) 200 may be or include one or more different types of EM and/or charged particle microscopes, such as, but not limited to, a scanning electron microscope (SEM), a scanning transmission electron microscope (STEM), a transmission electron microscope (TEM), a charged particle microscope (CPM), focused ion beam (FIB) setups, dual beam microscopy system, etc.

FIG. 2 illustrates the example charged particle beam system(s) 200 as including a charged particle beam tool 202 includes a column 204 that provides one or more focused charged particle beams 206 directed towards a sample 208 positioned on a sample holder 210. To provide the focused charged particle beam(s) 206, the column 204 can include an ion source, optics, and other structure. For example, the column 204 may be a coaxial photon-ion column, which is configured to provide a focused ion beam.

FIG. 2 further illustrates the example charged particle beam system(s) 200 as including a chemistry injection tool 212, and a detection system 214. The chemistry injection tool 212 is shown as including a chemistry injector tube 216 configured to provide a gas from a chemical repository 218 to the sample 208. The detection system 214 for detecting particles or other emissions emanated as a result of the focused charged particle beam 206 being incident on the sample 208. Detection system 214 includes a detector 220 and a guide 222. For example, a bias voltage applied to the guide 222 may cause the guide 222 to generate an electric field that applies forces to charged particles that guide the charged particles to the detector 220.

The example charged particle beam system(s) 200 further includes a confocal sensor system 224 that comprises a beam emitter 226 and a beam detector 228. The beam emitter 226 is configured to emit a multichromatic beam 230 to be incident on a surface. For example, FIG. 2 shows the beam emitter 226 emitting multichromatic beam 230 so that it is incident on the surface 232 of sample 208. The beam emitter 226 includes components that cause light of different wavelengths within the multichromatic 230 beam have different corresponding focal lengths. In some embodiments, the beam emitter 226 may include one or more lenses having a high degree of chromatic aberration, etc. For example, the beam emitter 226 includes a light source 234 that generates and directs multichromatic light through at least one lens having a high degree of chromatic aberration such that, after the multichromatic beam emitted by the light source passes through the at least one lens, the light of different wavelengths within the multichromatic beam 230 have different corresponding focal lengths.

The beam detector 228 is configured to detect a portion of the multichromatic beam 236 that is reflected by the surface 232. Since the different wavelengths within the multichromatic beam 230 have different corresponding focal lengths, the wavelengths within the portion of the multichromatic beam 236 that are incident upon the beam detector 228 are indicative of the relative position between the surface 232 and the beam emitter 226. That is, the wavelength(s) of light that are detected in the largest quantity by the beam detector 228 correspond to the wavelengths light having a focal length equal to or proximate to the distance between the surface 232 and the beam emitter 226.

FIG. 2 further depicts the confocal sensor system 224 as including computing element(s) 238. The computing element(s) 238 may include any combination of hardware or software that can perform the indicated functions, including computers, network devices, internet appliances, PDAs, wireless phones, controllers, cameras, displays, data storage devices, oscilloscopes, amplifiers, etc. The computing element(s) 238 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

The computing element(s) 238 may be a component of the example charged particle beam system(s) 200 and/or confocal sensor system 224, may be a separate device from the charged particle beam system(s) 200 and/or confocal sensor system 224 which is in communication with the example charged particle beam system(s) 200 and/or confocal sensor system 224 via a network communication interface, or a combination thereof.

In some embodiments, the computing element(s) 238 are configured to determine the wavelengths(s) that are most prevalent in the reflected portion of the multichromatic beam 236, and then determine a relative position between the surface 232 of sample 208 and the beam emitter 226, the charged particle beam tool 202, the example charged particle beam system(s) 200, or a combination thereof. For example, in some embodiments the computing element(s) 238 may include a spectrometer that is configured to receive sensor data from the beam detector 228 and determine the wavelengths of light within the reflected portion of the multichromatic beam 236 and/or the ratio of light of each wavelength within the reflected portion of the multichromatic beam 236. In such embodiments, the computing element(s) 238 may determine which wavelengths of light have the highest prevalence in the reflected portion of the multichromatic beam 236 based at least in part on the spectrometer.

Additionally, the computing element(s) 238 may further be configured to adjust the settings and/or performance of the example charged particle beam system(s) 200 based on the relative position of the sample 208. For example, the computing element(s) 238 may cause the charged particle beam tool 202 to change the focus of and/or change the location of a focused charged particle beam 206 so that it is incident on a target location of the sample 208. For example, an example EM and/or charged particle microscope setup 100 may include a computing element which acts as a controller that drives the operation of the confocal sensor system 224, example charged particle beam system(s) 200, and/or portions thereof (e.g., adjust the scanning location on the sample 208 by operating the scan coils in the column 204, adjust the size/shape/position of the variable aperture in the column 204, cause the sample holder 210 to translate the sample 208, etc.). In such an embodiment, the computing element(s) 238 may be configured to automate one or more actions of the charged particle system based on the relative position of the sample 208.

As shown in FIG. 2, each of the beam emitter 226 the beam detector 228 are positioned so that the multichromatic beam 236 and reflected portion 236 are able to travel around the charged particle beam tool 202. For example, the beam emitter 226 and the beam detector 228 may be each positioned between 10 mm and 250 mm of the surface of the sample, and oriented so that the portion of the multichromatic beam 236 that is reflected off the surface 232 strikes a receiving optical surface of the beam detector 228. This allows the confocal sensor system 224 to determine the relative position of the surface 232 and/or sample 208 without interfering with other operations/functionalities of the example charged particle beam system(s) 200. In some embodiments, the confocal sensor system 224 to determine the relative position of the surface 232 and/or sample 208 while the charged particle beam tool 202 causes one or more focused charged particle beams 206 to be directed towards a sample 208.

The computing element(s) 238 include one or more processors configured to execute instructions, applications, or programs stored in a memory(s) accessible to the one or more processors. In some examples, the one or more processors may include hardware processors that include, without limitation, a hardware central processing unit (CPU), a graphics processing unit (GPU), and so on. While in many instances the techniques are described herein as being performed by the one or more processors, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories accessible to the one or more processors are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory and other storage devices for purposes of memory management and data integrity. Alternatively, in other implementations, some or all of the software components may execute in memory on another device and communicate with the computing element(s) 238. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing element(s) 238 may be transmitted to the computing element(s) 238 via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

Figure 3:
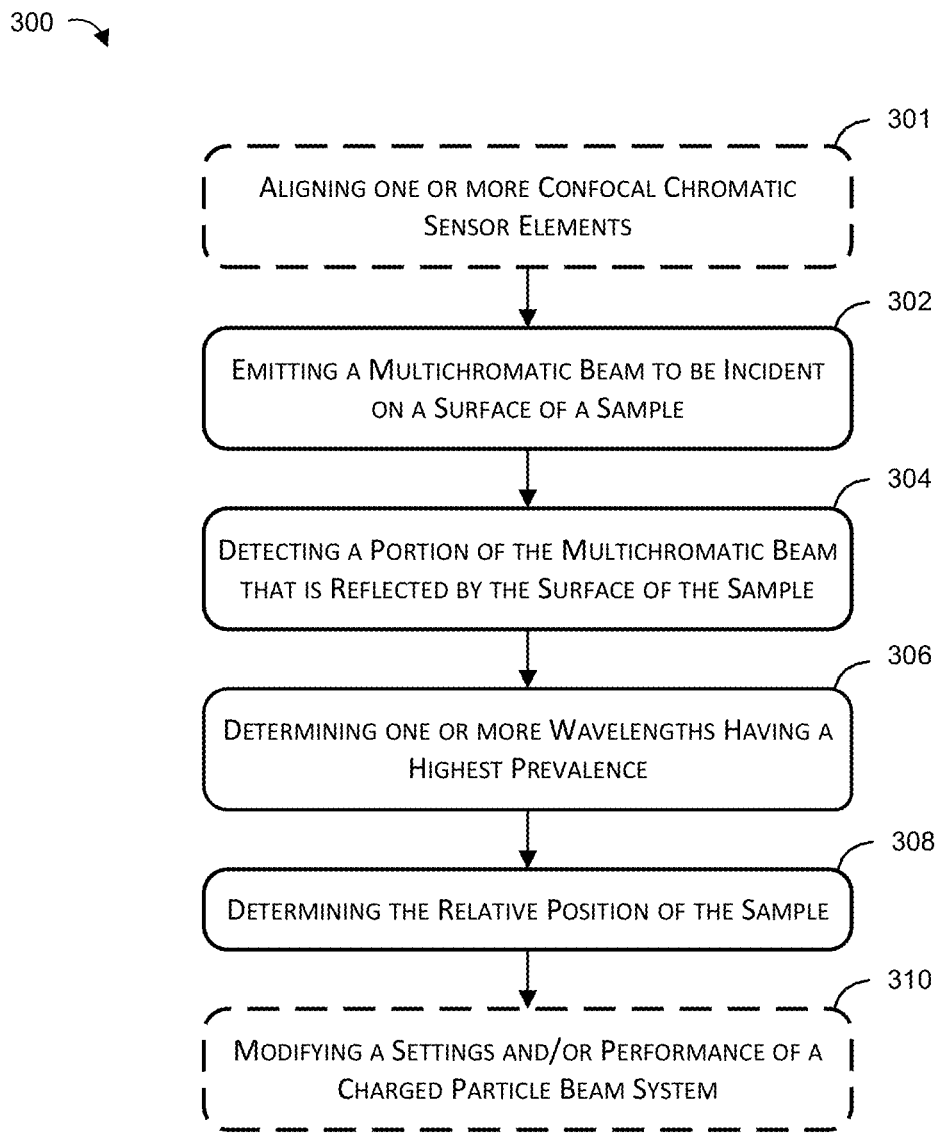
FIG. 3 depicts an example process for determining the relative position of a sample in a charged particle system.

FIG. 3 is a flow diagram of illustrative processes illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

FIG. 3 is a flow diagram of an illustrative process 300 for determining the relative position of a sample in a charged particle system. The process 300 may be implemented in example charged particle beam system(s) 200 and/or by the computing element(s) 238 described above, or in other environments and computing devices.

At 301, one or more confocal chromatic sensor elements are optionally aligned to calibrate the confocal chromatic sensor system. For example, the position and/or angle a beam emitter, a beam detector, or both may be adjusted in relation to the sample and/or the charged particle system. For example, the position and/or angle of the beam emitter may be adjusted so that (i) the chromatic spread of a multichromatic beam emitted by the beam emitter is arranged around a surface of the sample, and/or (ii) portions of the multichromatic beam that are reflected by the surface of the sample strike and/or are focused on the beam detector. Alternatively, or in addition, the position and/or angle of the beam detector may be adjusted so that a greater amount of the portions of the multichromatic beam which are reflected by the surface strike the beam detector and/or are focused by the beam detector onto a fiberoptic element, sensors, a spectrometer, an oscilloscope, etc.

At 302, the beam emitter emits a multichromatic beam that is incident on a surface of a sample. The multichromatic beam is composed of light having different wavelengths, and each wavelength of light within the multichromatic beam is emitted by the beam emitter as having a different focal length. For example, the beam emitter may include a light source that generates a multichromatic beam, and a lens having a high degree of chromatic aberration that focuses the multichromatic beam such that each wavelength of light that passes through the lens has a different focal length.

At 304, a portion of the multichromatic beam that is reflected by the surface of the sample is detected by a beam detector that is separate from the beam emitter. The beam detector being separate from the beam emitter corresponds to the beam emitter having an emitting optical surface that is a most proximate optical surface of the beam emitter to the surface of the sample and through which the multichromatic beam is emitted, and the beam detector having a receiving optical surface that is a most proximate optical surface of the beam detector to the surface of the sample and through which the portion of the multichromatic beam is received, where the emitting optical surface is different from the receiving optical surface. For example, the beam detector may be positioned so that a portion of the multichromatic beam emitted by the beam emitter that is reflected off the surface strikes the receiving optical surface of the beam detector. In some embodiments, the beam emitter and/or the beam detector may be positioned between 10 mm and 250 mm of the surface of the sample. When the beam emitter and the beam detector are separate and positioned in this way the monochromatic light is able to strike a surface and have the reflected portion be detected without interfering with other instruments (e.g., a charged particle beam column, or other system that is substantially normal to the surface).

At 306, one or more wavelengths having a highest prevalence within the portion of the multichromatic beam are determined. For example, in some embodiments one or more computing element(s) may be configured to receive sensor data from the beam detector, and then determine the wavelengths of light within the reflected portion of the multichromatic beam and/or the ratio of light of each wavelength within the reflected portion of the multichromatic beam. In such embodiments, the computing element(s) may determine which wavelengths of light have the highest prevalence in the reflected portion of the multichromatic beam based at least in part on the spectrometer.

At 308, the relative position of the sample is determined. For example, since the different wavelengths within the multichromatic beam have different corresponding focal lengths, the wavelengths within the portion of the multichromatic beam that are incident upon the beam detector are indicative of the relative position between the surface and the beam emitter. In other words, the system may first determine the particular wavelength of light that are present in the largest quantity by the beam detector, determine the corresponding focal length of the particular wavelength, and determine the relative position of the sample based on the corresponding focal length. In embodiments where the portion of the multichromatic beam received by the beam detector contains more than one peak wavelength, the system may determine relative positions of multiple regions and/or portions of the sample. For example, where the portion of the multichromatic beam is determined to include a first peak wavelength that corresponds to light reflected by the front surface of the sample, and a second peak wavelength that corresponds to light reflected by a back surface of the sample, the system may use the first peak wavelength to determine a relative position of the front surface, and use the second peak wavelength to determine a relative position of the back surface. In such embodiments the system may also use the first and second peak wavelengths to determine a thickness of the sample.

At 310 the settings and/or performance of the charged particle beam system are optionally modified. For example, the focus of and/or location of a focused charged particle beam may be adjusted based on the relative position of the sample so that the focused charged particle beam is focused/incident on a target location of the sample. Such and adjustment may include, but is not limited to, adjust the scanning location on the sample by operating the scan coils in the column, adjust the size/shape/position of the variable aperture in the column, cause the sample holder to translate and/or rotate the sample in one or more dimensions/axis of rotation, etc. Alternatively, or in addition, the relative position of the sample may be used to automate one or more functionalities of the charged particle beam system, such as imaging, lamella preparation, etching, deposition, etc.

Figure 4:
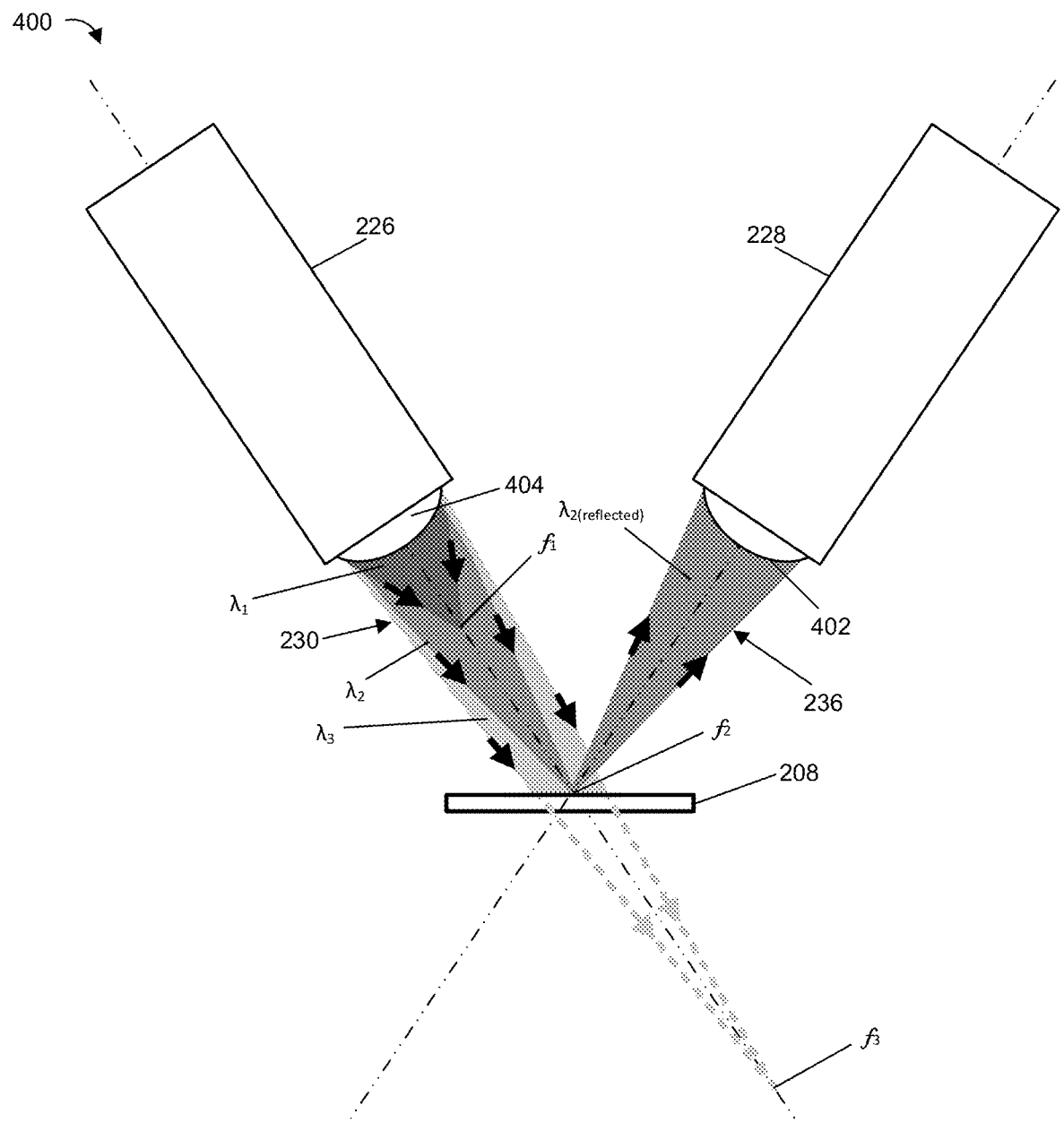
FIG. 4 illustrates a schematic diagram showing the operation of a confocal chromatic sensor system according to the present disclosure.

FIG. 4 illustrates a detailed schematic showing the operation of a confocal chromatic sensor system 400 according to the present disclosure. FIG. 4 shows a beam emitter 226 that directs a multichromatic beam 230 that is directed to be incident on a surface of sample 208, such that a portion of the multichromatic beam 236 is reflected to be incident upon a receiving optical surface 402 of a beam detector 228. Specifically, FIG. 4 shows the multichromatic beam 230 as passing through a lens 404 having a high degree of chromatic aberration that focuses the multichromatic beam 230 such that each wavelength of light (e.g., $\lambda_1$, $\lambda_2$, and $\lambda_3$) that passes through the lens 402 has a different focal length (e.g., $f_1$, $f_2$, and $f_3$). As shown in FIG. 4, the wavelength of light (i.e., $\lambda_2$) whose focal length (i.e., $f_2$) corresponds to the distance between the beam emitter 226 and the sample 208 is also the wavelength of light (i.e., $\lambda_{2(reflected)}$) that is received by the beam detector 228 in the greatest quantity.

Figure 5:
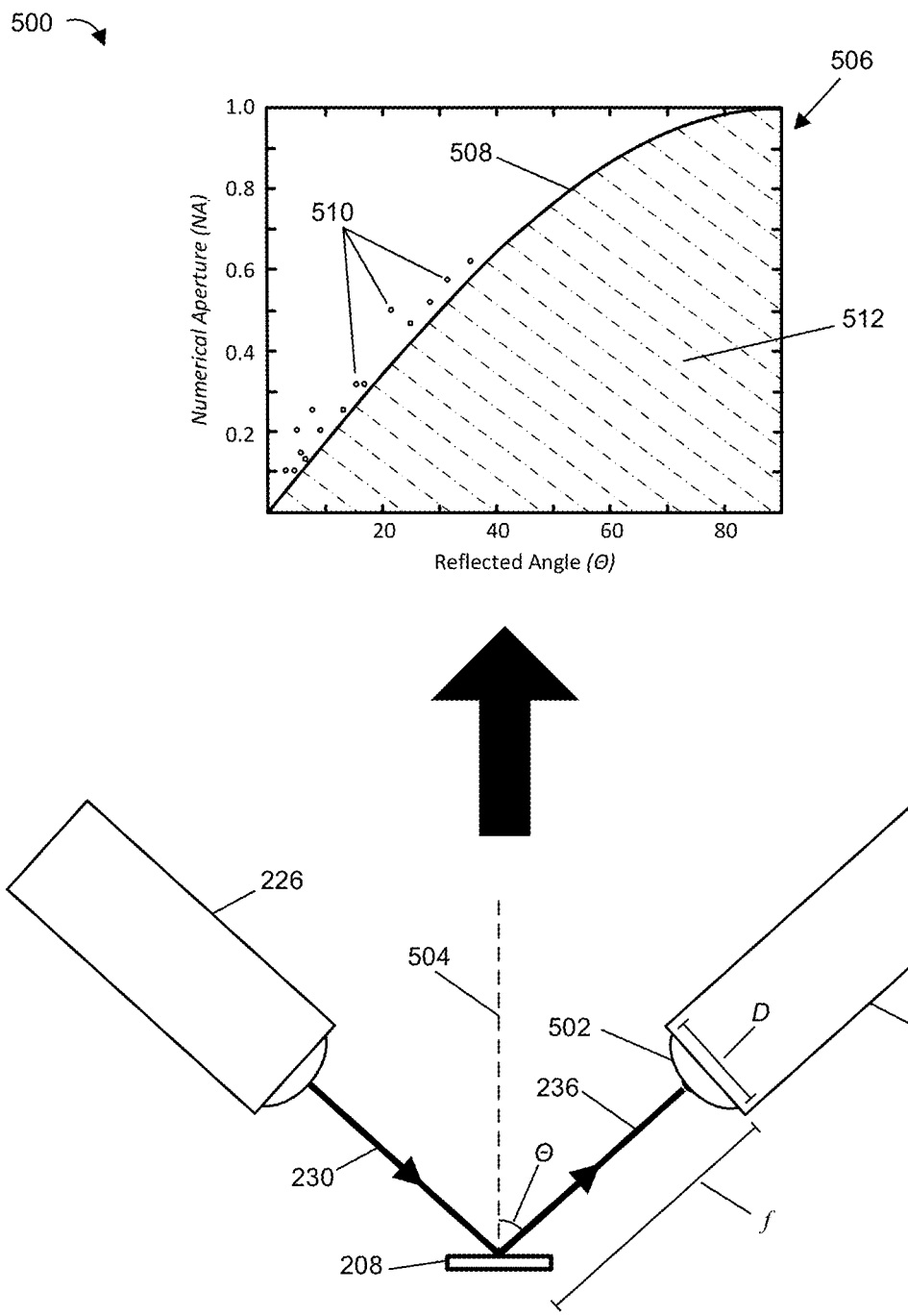
FIG. 5 illustrates a schematic diagram showing the operating principles for the confocal chromatic sensor system according to the present disclosure, as well as the potential numerical apertures utilized by such a system.

FIG. 5 illustrates a detailed view of the operating principles for the confocal chromatic sensor system 500 as well as the potential numerical apertures utilized by such a system, according to the present disclosure. Specifically, FIG. 5 shows a beam emitter 226 that directs a multichromatic beam 230 that is directed to be incident on a surface of sample 208. It also illustrates a portion of the multichromatic beam 236 being reflected so that it is received by an optical element 502 of a beam detector 228. FIG. 5 illustrates the portion of the multichromatic beam 236 being reflected at a reflection angle Θ from a normal 504 of the surface of the sample 208.

The optical element 502 has an entrance pupil diameter D and a focal length f. The optical element 502 may be a lens, a fiberoptic wire, a light guide, a light pipe, or other optical element having a numerical aperture (NA) that allows light at a subset of reflected angles Θ to be received by the optical element 502. The numerical aperture of the optical element 502 is equal to the sin of the reflection angle Θ multiplied by the index of refraction of the medium through which the portion of the multichromatic beam 236 travels between the sample 208 and the beam detector 228. Because the index of refraction of air is approximately 1, this relationship can be simplified to:

$$NA \approx \sin \Theta \approx D/2f \qquad (1)$$

For prior art confocal chromatic sensor systems, corresponding receiving optical elements were limited to having numerical apertures that were greater than the value of sin Θ. On the other hand, the confocal chromatic sensor system 500 according to the present disclosure is able to have the optical element 502 have a numerical aperture that is less than the value of sin Θ. Additionally, the optical element 502 is able to an entrance pupil diameter D that is less than the value of twice its focal length multiplied by sin Θ. This means that the confocal chromatic sensor system 500 according to the present disclosure is able to include an optical element 502 having a numerical aperture NA and/or entrance pupil diameter D that was not achievable in prior art confocal chromatic sensor systems. This is illustrated in graph 506, which shows a line 508 that corresponds to NA=sin Θ. Graph 506 also includes a collection of plotted values 510 of the numerical aperture NA vs the maximum sensor tilt angles for prior art confocal chromatic sensor systems. The maximum sensor tilt angles are the maximum sensor tilt angle that produces a usable signal on a surface, near to the midrange. As can be seen in graph 506, each of the plotted values 510 are greater than the line 508 (i.e., the numerical aperture of the prior art systems is greater than sin Θ). By contrast, the optical element 502 according to the present disclosure is able to utilize numerical apertures that are within the shaded region 512 below line 508. That is, the optical element 502 is able to have a numerical aperture less than the sin of the reflection angle Θ.

Figure 6:
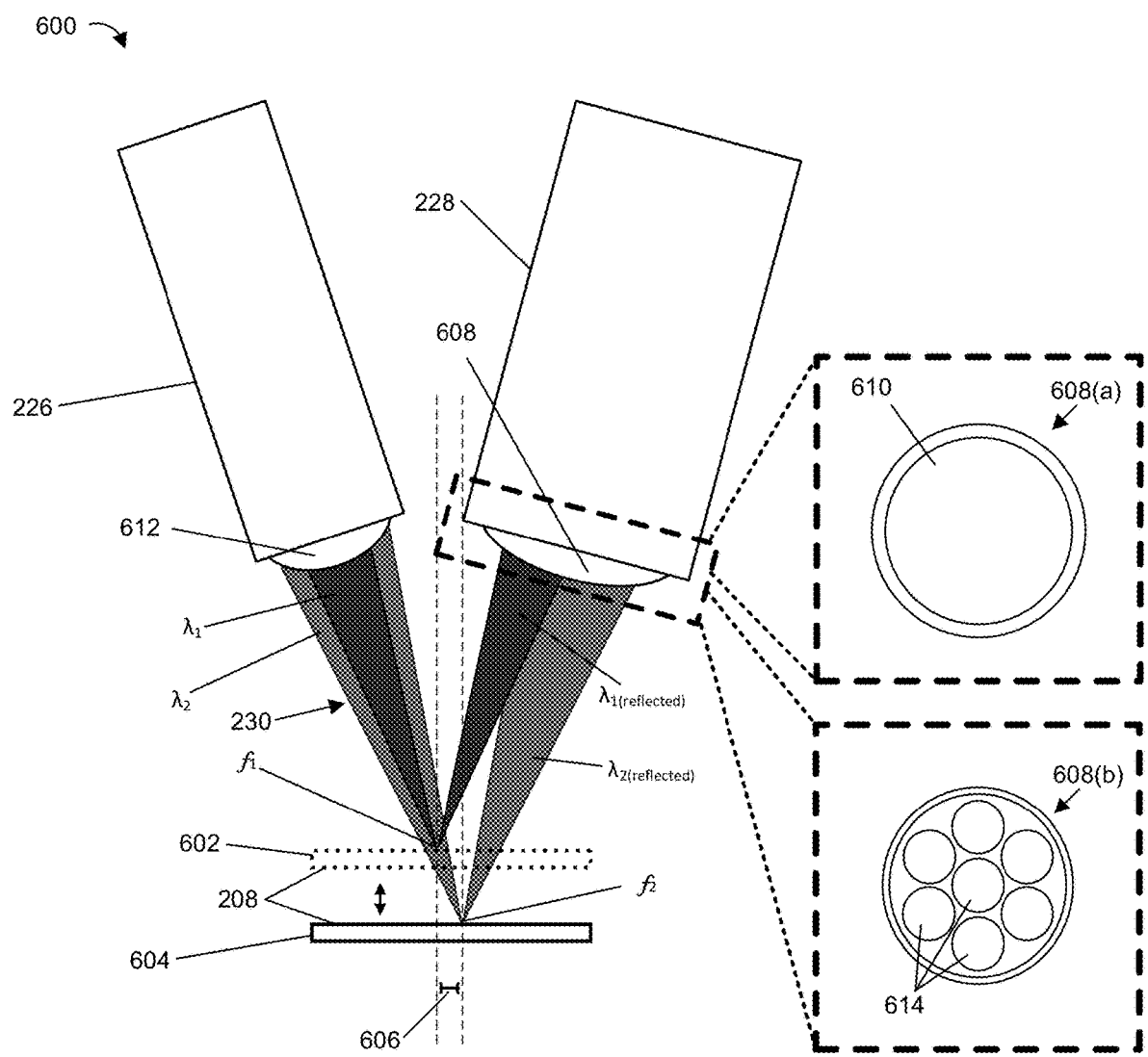
FIG. 6 is a diagram that shows a confocal chromatic sensor system designed to compensate for translations of the sample, according to the present disclosure.

FIG. 6 illustrates a detailed view of a confocal chromatic sensor system 600 designed to compensate for translations of the sample, according to the present disclosure. Specifically, FIG. 6 shows a beam emitter 226 that directs a multichromatic beam 230 that is directed to be incident on a surface of sample 208 when the sample is in a first position 602 and when the sample is in a second position 604. In some embodiments, a sample holder of a focused charged particle system may be configured to adjust the distance between the sample 208 and a focused charged particle beam tool/column by translating the sample 208 the first position 602 and second position 604 may correspond to different sample positions. As seen in FIG. 6, when the sample 208 is in the first position 602, light of a first wavelength (i.e., $\lambda_1$) having a focal length (i.e., $f_1$) equal to the distance between the beam emitter 226 and the sample is reflected (i.e., $\lambda_{1(reflected)}$) to be incident on a receiving optical surface 606 of the beam detector 228. Alternatively, when the sample 208 is in the second position 604, light of a second wavelength (i.e., $\lambda_2$) having a focal length (i.e., $f_2$) equal to the distance between the beam emitter 226 and the sample is reflected (i.e., $\lambda_{2(reflected)}$) to be incident on a receiving optical surface 606 of the beam detector 228.

As can be seen in FIG. 6, when the sample 208 is translated from the first position 602 to the second position 604 the point that the multichromatic beam strikes the sample is shifted a distance 606. This causes the path of the reflected portion of the multichromatic beam travels along a different path and/or is incident on a different region of the receiving optical surface 608 of the beam detector 228. FIG. 6 shows a depiction of two embodiments of receiving optical surface 608 that are designed to compensate for this change in path/incidence region. In a first example, receiving optical surface 506(a) encompass a receiving area 610 that is larger than the area of the lens 612 of the beam emitter 226. Because of this increased receiving area 610, the reflected portion of the multichromatic beam to be sensed regardless of the change of the path and/or area of incidence. In a second example, receiving optical surface 608(b) includes a plurality of optical fibers 614 that are each configured to receive the reflected portion of the multichromatic beam. In this way, when a translation of the sample 208 causes the path and/or region of incidence upon the receiving optical surface to shift, a different set of optical fibers 614 may receive the reflected light.

Figure 7:
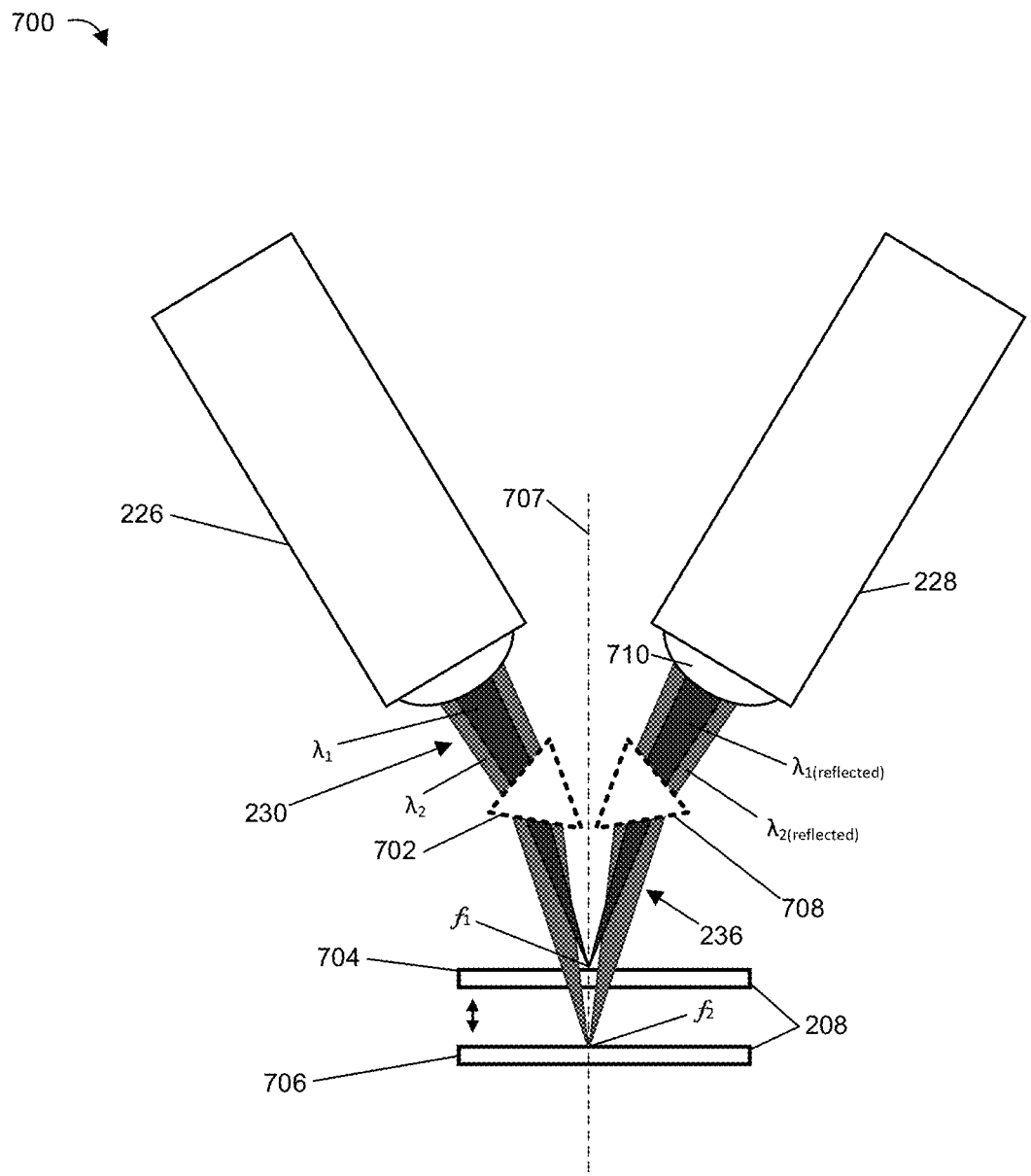
FIG. 7 is a diagram that shows a confocal chromatic sensor system that includes one or more prisms configured to compensate for translations of the sample, according to the present disclosure.

FIG. 7 illustrates an alternative embodiment to compensate for the shift in the path and/or region of incidence upon the receiving optical surface caused by a translation of the sample 208. Specifically, FIG. 7 illustrates a detailed view of a confocal chromatic sensor system 700 that optionally includes one or more prisms 702 configured to compensate for translations of the sample, according to the present disclosure. Prism 702 is positioned to refract the individual wavelengths of light (e.g., $\lambda_1$ and $\lambda_2$) in the multichromatic beam 230 so that they are incident upon the same portion of the sample 208 when the sample 208 is vertically translated between a first position 704 and a second position 706 along an axis of translation 707. Alternatively, or in addition, the confocal chromatic sensor system 700 may include an additional prism 708 that is configured to refract the portion of the multichromatic beam 236 that is reflected by the sample 208 so that it strikes the same (or a substantially similar) region of the receiving optical surface 710 of the beam detector 228 irrespective of the vertical translation applied to the sample 208. That is, the additional prism 708 may be configured to refract the portion of the multichromatic beam 236 that is reflected by the sample 208 so that it strikes substantially the same region of the receiving optical surface 710 when the sample is in the first position 704 and in the second position 706.

Figure 8:
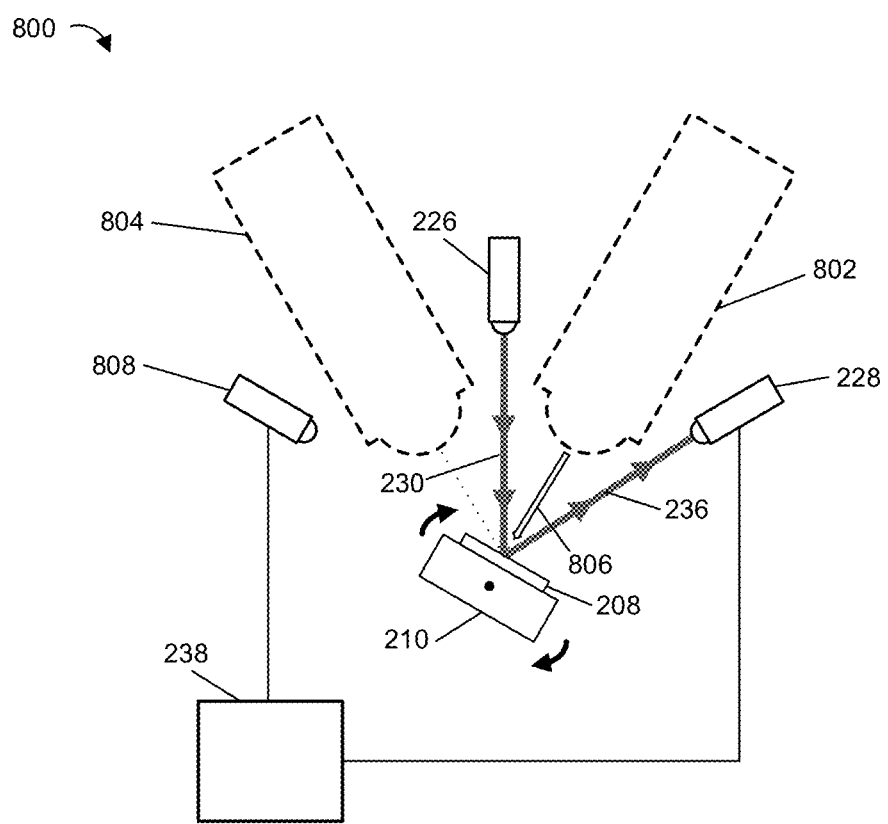
FIG. 8 is a diagram that illustrates a multi-beam charged particle beam system having a plurality of beam detectors, where the sample is in a first position.
Figure 9:
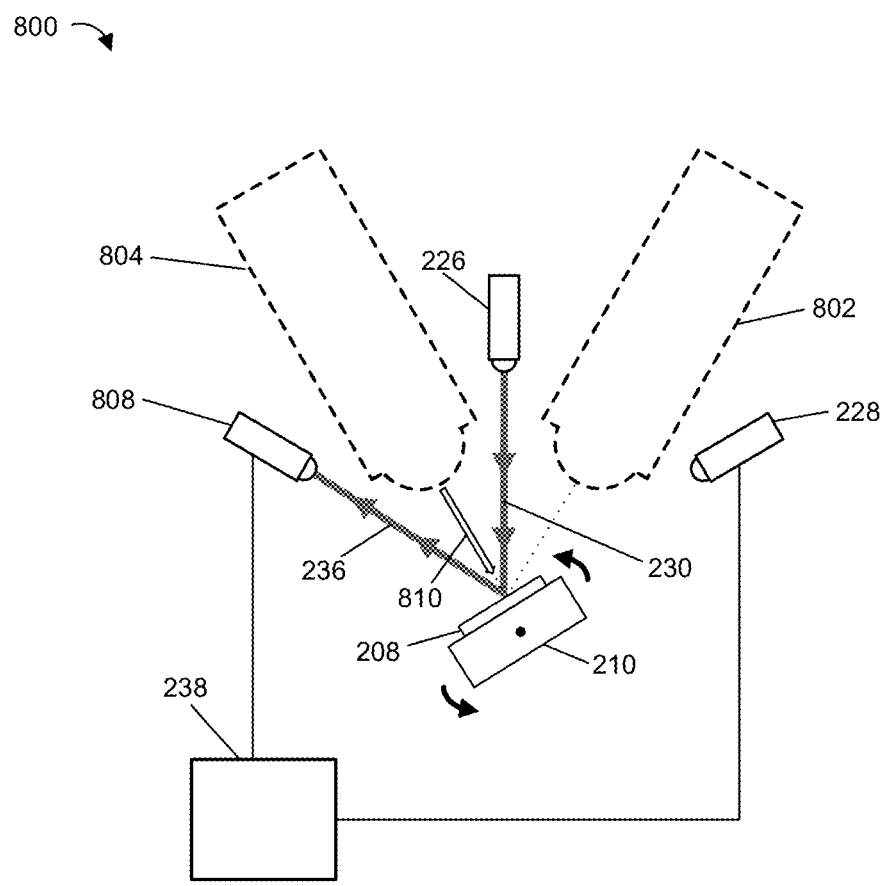
FIG. 9 is a diagram that illustrates the multi-beam charged particle beam system of FIG. 8 having a plurality of beam detectors, where the sample is in a second position.
Figure 10:
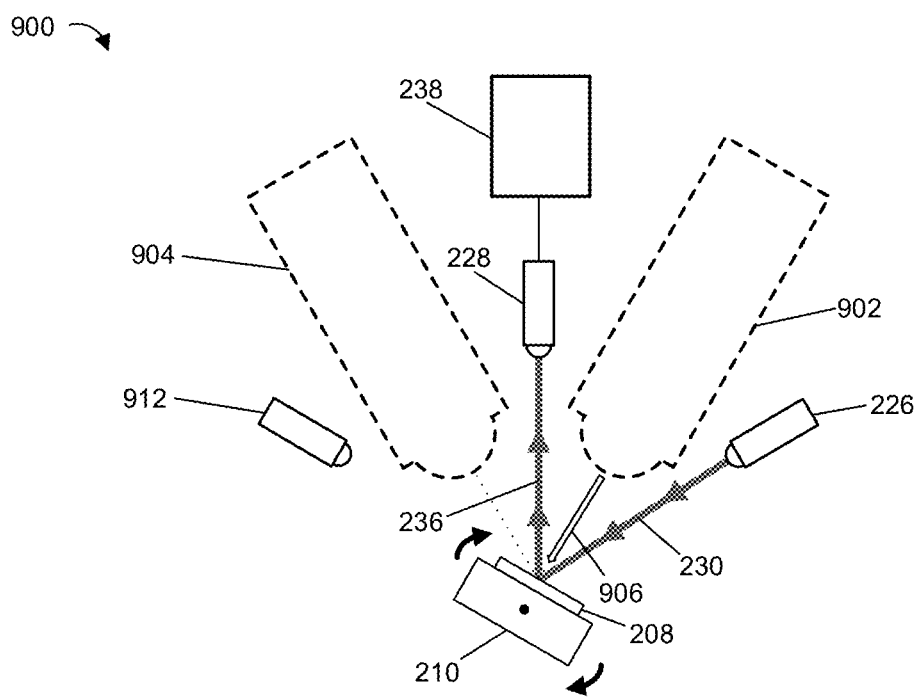
FIG. 10 is a diagram that illustrates the multi-beam charged particle beam system of FIG. 8 having a plurality of beam emitters, where the sample is in a first position.
Figure 11:
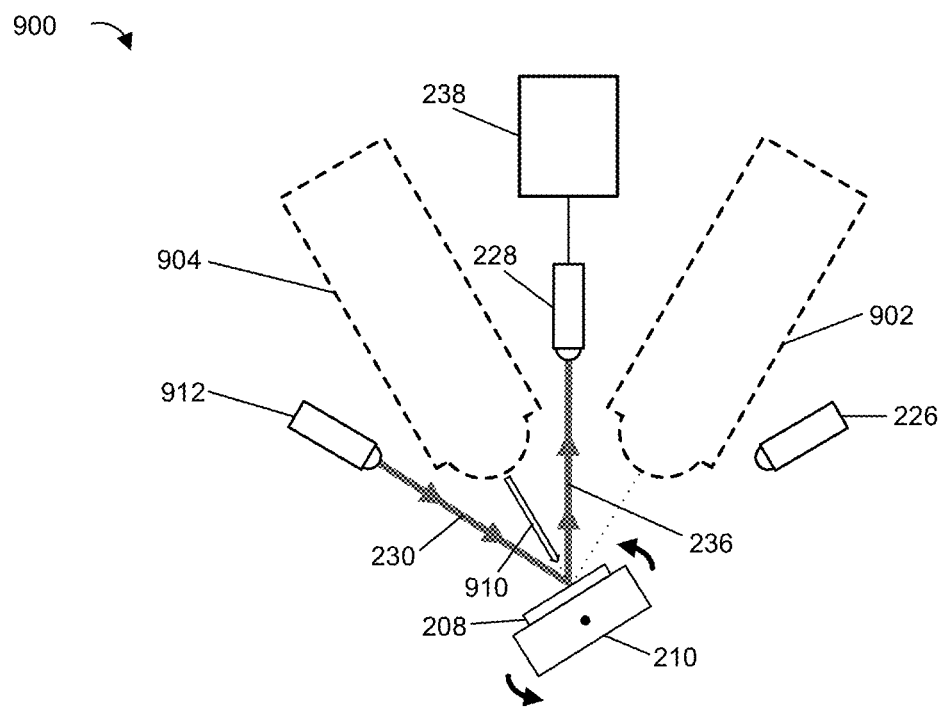
FIG. 11 is a diagram that illustrates the multi-beam charged particle beam system of FIG. 8 having a plurality of beam emitters, where the sample is in a second position.

FIGS. 8-11 illustrate multi-beam charged particle beam systems 800 and 900 that include example confocal chromatic sensor systems according to the present disclosure. Specifically, FIGS. 8-9 illustrate multi-beam charged particle beam systems 800 that include example confocal chromatic sensor systems having a plurality of beam detectors. FIGS. 10-11 illustrate multi-beam charged particle beam systems 900 that include example confocal chromatic sensor systems having a plurality of beam emitters.

For example, FIG. 8 illustrates a multi-beam charged particle beam system 800 having a plurality of beam detectors, where the sample is in a first position. Multi-beam charged particle beam system 800 is shown as including a first charged particle beam tool 802 and a second charged particle beam tool 804. Individual ones of the first charged particle beam tool 802 and the second charged particle beam tool 804 may correspond to different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc.

FIG. 8 further shows the sample 208 being held by a sample holder 210 in a first position where the sample 208 is normal (or substantially normal) to a focused charged particle beam 806 from the first charged particle beam tool 802. FIG. 8 also illustrates the multi-beam charged particle beam system 800 as including a beam emitter 226 configured to direct a multichromatic beam 230 to be incident on the sample 208 such that, when the sample is in the first position, the portion of the multichromatic beam 236 that is reflected by the sample 208 strikes a beam detector 228. FIG. 8 also illustrates computing element(s) 238 that are in communication with the beam detector 228 and configured to determine the wavelengths(s) that are most prevalent in the reflected portion of the multichromatic beam 236, and then determine a relative position between the surface 232 of sample 208 and the beam emitter 226, the first charged particle beam tool 802, or a combination thereof. The multi-beam charged particle beam system 800 is shown as also including an additional beam detector 808 in communication with the computing element(s) 238.

FIG. 9 illustrates multi-beam charged particle beam system 800 having a plurality of beam detectors, where the sample is in a second position. FIG. 9 shows the sample 208 being held by the sample holder 210 in a second position where the sample 208 is normal (or substantially normal) to a focused charged particle beam 810 from the second charged particle beam tool 804. FIG. 9 also illustrates beam emitter 226 being configured to direct a multichromatic beam 230 to be incident on the sample 208 such that, when the sample is in the second position, the portion of the multichromatic beam 236 that is reflected by the sample 208 strikes the additional beam detector 808. The computing element(s) 238 are then configured to determine the wavelengths(s) that are most prevalent in the reflected portion of the multichromatic beam 236, and then determine a relative position between the surface 232 of sample 208 and the beam emitter 226, the second charged particle beam tool 804, or a combination thereof.

FIG. 10 illustrates a multi-beam charged particle beam system 900 having a plurality of beam emitters, where the sample is in a first position. Multi-beam charged particle beam system 900 is shown as including a first charged particle beam tool 902 and a second charged particle beam tool 904. Individual ones of the first charged particle beam tool 902 and the second charged particle beam tool 904 may correspond to different types of EM and/or charged particle microscopes, such as, but not limited to, a scanning electron microscope (SEM), a scanning transmission electron microscope (STEM), a transmission electron microscope (TEM), a charged particle microscope (CPM), dual beam microscopy system, etc.

FIG. 10 shows the sample 208 being held by a sample holder 210 in a first position where the sample 208 is normal (or substantially normal) to a focused charged particle beam 906 from the first charged particle beam tool 902. FIG. 10 also illustrates the beam emitter 226 as being configured to direct a multichromatic beam 230 to be incident on the sample 208 such that, when the sample is in the first position, the portion of the multichromatic beam 236 that is reflected by the sample 208 strikes a beam detector 228. FIG. 10 also illustrates computing element(s) 238 that are in communication with the beam detector 228 and configured to determine the wavelengths(s) that are most prevalent in the reflected portion of the multichromatic beam 236, and then determine a relative position between the surface 232 of sample 208 and the beam emitter 226, the first charged particle beam tool 902, or a combination thereof. The multi-beam charged particle beam system 900 is shown as also including an additional beam emitter 912.

FIG. 11 illustrates multi-beam charged particle beam system 900 having a plurality of beam emitters, where the sample is in a second position. Specifically, FIG. 11 shows the sample 208 being held by the sample holder 210 in a second position where the sample 208 is normal (or substantially normal) to a focused charged particle beam 910 from the second charged particle beam tool 904. FIG. 11 also illustrates the additional beam emitter 912 being configured to direct a multichromatic beam 230 to be incident on the sample 208 such that, when the sample is in the second position, the portion of the multichromatic beam 236 that is reflected by the sample 208 strikes the beam detector 228. The computing element(s) 238 are then configured to determine the wavelengths(s) that are most prevalent in the reflected portion of the multichromatic beam 236, and then determine a relative position between the surface 232 of sample 208 and the additional beam emitter 912, the second charged particle beam tool 904, or a combination thereof.

Examples of inventive subject matter according to the present disclosure are described in the following enumerated paragraphs.

A1. A confocal chromatic sensor system, comprising:
a beam emitter configured to emit a multichromatic beam to be incident on a surface, wherein light of different wavelengths within the multichromatic beam have different corresponding focal lengths; and
a beam detector separate from the beam emitter that is configured to detect a portion of the multichromatic beam that is reflected by the surface.

A1.1. The confocal chromatic sensor system of paragraph A1, wherein the beam detector comprises an optical element configured to receive the portion of the multichromatic beam that is reflected by the surface.

A1.1.1. The confocal chromatic sensor system of paragraph A1.1, wherein the optical element has a numerical aperture that is less than the sin of the reflection angle between the portion of the multichromatic beam that is reflected and a normal extending from the surface at the point of reflection.

A1.1.2. The confocal chromatic sensor system of any of paragraphs A1.1-A1.1.1, wherein the optical element has an entrance pupil diameter that is less than that is less than twice the focal length multiplied by the sin of the reflection angle between the portion of the multichromatic beam that is reflected and a normal extending from the surface at the point of reflection.

A1.2. The confocal chromatic sensor system of any of paragraphs A1-A1.1.2, wherein the beam emitter comprises an emitting optical surface that is a most proximate optical surface of the beam emitter to the surface, the beam detector comprises a receiving optical surface that is a most proximate optical surface of the beam detector to the surface.

A1.2.1. The confocal chromatic sensor system of paragraph A1.2, wherein the beam detector being separate from the beam emitter corresponds to the emitting optical surface being different from the receiving optical surface.

A1.2.2. The confocal chromatic sensor system of any of paragraphs A1.2-A1.2.1, wherein the multichromatic beam is emitted by the beam emitter through the emitting optical surface, and the portion of the multichromatic beam is received by the beam detector through the receiving optical surface.

A1.3. The confocal chromatic sensor system of any of paragraphs A1-A1.2.2, wherein the beam emitter comprises:
a light source configured to emit the multichromatic beam; and at least one lens having a high degree of chromatic aberration such that, after the multichromatic beam emitted by the light source passes through the at least one lens, the light of different wavelengths within the multichromatic beam have different corresponding focal lengths.

A2. The confocal chromatic sensor system of any of paragraphs A1-A1.1, further comprising: a processing unit;
a memory storing computer readable instructions that, when executed on the processing unit cause the processing unit to perform the steps of:
determining one or more wavelengths having a highest prevalence in the detected portion of the multichromatic beam; and determining, based on the one or more wavelengths, a distance between the surface and the beam emitter.

A2.1. The confocal chromatic sensor system of any of paragraphs A1-A1.1, further comprising a spectrometer, and wherein the one or more wavelengths having a highest prevalence in the detected portion of the multichromatic beam are determined based at least in part on a signal generated by the spectrometer.

A3. The confocal chromatic sensor system of any of paragraphs A1-A2.1, wherein the surface is the surface of a sample, and further comprising: a sample holder configured to hold the sample; and a charged particle beam column configured to cause a charged particle beam to be incident on the surface of the sample.

A4. The confocal chromatic sensor system of paragraph A3, wherein the instructions are further executable to cause the processing unit to determine a relative position of the sample in relation to the charged particle beam column.

A5. The confocal chromatic sensor system of any of paragraphs A3-A4, wherein the instructions are further executable to adjust a performance of and/or settings of the charged particle beam system based on the distance between the surface and the emitter.

A6. The confocal chromatic sensor system of any of paragraphs A3-A5, wherein the instructions are further executable to automate one or more actions of the charged particle beam system based on the distance between the surface and the emitter.

A7. The confocal chromatic sensor system of any of paragraphs A3-A6, wherein one or both of the beam emitter and the beam detector are positioned between 10 mm and 250 mm of the surface of the sample.

A8. The confocal chromatic sensor system of any of paragraphs A3-A7, wherein the beam emitter is positioned on a first side of the charged particle beam column, and the beam detector is positioned on a second side of the charged particle beam that is different from the first side.

A9. The confocal chromatic sensor system of any of paragraphs A3-A8, wherein the beam emitter is positioned so that the portion of the multichromatic beam that is reflected by the surface of the sample strikes a receiving optical surface of the beam detector.

A10. The confocal chromatic sensor system of any of paragraphs A3-A9, wherein the charged particle beam column is a focused ion beam column configured to cause a focused ion beam to be incident on the surface of the sample.

A11. The confocal chromatic sensor system of any of paragraphs A3-A10, wherein the charged particle beam column is an electron beam column configured to cause an electron beam to be incident on the surface of the sample.

A12. The confocal chromatic sensor system of any of paragraphs A3-A11, further comprising an additional charged particle beam column.

A12.1. The confocal chromatic sensor system of paragraph A12, wherein one of the charged particle beam column and the additional charged particle beam column is a focused ion beam column configured to cause a focused ion beam to be incident on the surface of the sample, and the other is an electron beam column configured to cause an electron beam to be incident on the surface of the sample.

A12.2. The confocal chromatic sensor system of any of paragraphs A12-A12.1, wherein the sample holder is further configured to rotate the sample between a first rotational position where the surface of the sample is facing the charged particle beam column, and a second rotational position where the surface of the sample is facing the additional charged particle beam column.

A12.2.1. The confocal chromatic sensor system of paragraph A12.2, wherein the emitter is positioned so that the emitted multichromatic beam is incident on the surface of the sample when the sample is in the first rotational position and when the sample is in the second rotational position.

A12.2.1.1. The confocal chromatic sensor system of paragraph A12.2.1, further comprising an additional beam detector, and wherein:

the beam detector is positioned to detect the portion of the multichromatic beam that is reflected by the surface when the sample is in the first rotational position; and the additional beam detector is positioned to detect the portion of the multichromatic beam that is reflected by the surface when the sample is in the second rotational position.

A12.2.2. The confocal chromatic sensor system of paragraph A12.2, further comprising an additional beam emitter, and wherein:

the beam emitter is positioned to emit the multichromatic beam that is reflected by the surface when the sample is in the first rotational position; and the additional beam emitter is positioned to emit an additional multichromatic beam that is reflected by the surface when the sample is in the second rotational position.

A13. The confocal chromatic sensor system of any of paragraphs A3-A12.2.2, wherein the sample holder is further configured to translate the sample between a first position and a second position, wherein the second position is more proximate to the charged particle beam column than the first position.

A13.1. The confocal chromatic sensor system of paragraph A13, wherein a/the receiving optical surface of the beam detector is greater than an emitting optical surface of the beam emitter.

A13.2. The confocal chromatic sensor system of any of paragraphs A13-A13.1, wherein a/the receiving optical surface of the beam detector comprises a plurality of optical fibers individually configured to accept light.

A13.3. The confocal chromatic sensor system of any of paragraphs A13-A13.1, wherein the beam detector contains a plurality of optical fibers individually configured to accept light, and a/the receiving optical surface of the beam detector comprises a lens configured to direct light into the plurality of optical fibers.

A14. The confocal chromatic sensor system of any of paragraphs A13-A13.3, further comprising a prism located between the beam emitter and the sample and configured to cause the portion of the multichromatic beam that is reflected by the surface to strike the receiving optical surface of the beam detector when the sample is in the first position and the second position.

A14.1. The confocal chromatic sensor system of paragraph A14, further comprising an additional prism located between the sample and the beam detector and configured to cause the portion of the multichromatic beam that is reflected by the surface to strike the receiving optical surface of the beam detector when the sample is in the first position and the second position.

A15. The confocal chromatic sensor system of any of paragraphs A13-A13.3, further comprising a prism located between the sample and the beam detector and configured to cause the portion of the multichromatic beam that is reflected by the surface to strike the receiving optical surface of the beam detector when the sample is in the first position and the second position.

B1. A method for determining the relative position of a sample in a charged particle device, comprising:

emitting, by a beam emitter, a multichromatic beam to be incident on a surface of the sample, wherein light of different wavelengths within the multichromatic beam have different corresponding focal lengths;

detecting, by a beam detector separate from the beam emitter, a portion of the multichromatic beam that is reflected by the surface of the sample;

determining one or more wavelengths having a highest prevalence in the portion of the multichromatic beam; and determining the relative position of the sample in the charged particle device based on the one or more wavelengths.

B2. The method of paragraph B1, further comprising:

translating, via a sample holder, the sample to a new position relative to the beam emitter;

determining one or more additional wavelengths having a highest prevalence in the portion of the multichromatic beam when the sample is in the new position, wherein the one or more additional wavelengths are different from the one or more wavelengths; and determining a new relative position of the sample in the charged particle device based on the one or more additional wavelengths.

B3. The method of any of paragraphs B1-B2, further comprising rotating, via a/the sample holder, the sample between a first rotational position and a second rotational position.

B3.1. The method of paragraph B3, further comprising:

detecting, by an additional beam detector separate from the beam detector and when the sample is in the second rotational position, the portion of the multichromatic beam that is reflected by the surface of the sample;

determining one or more new wavelengths having a highest prevalence in the portion of the multichromatic beam when the sample is in the second rotational position; and determining a new relative position of the sample in the charged particle device based on the one or more new wavelengths.

B3.2. The method of paragraph B3, further comprising:

emitting, via an additional emitter, a new multichromatic beam to be incident on the surface of the sample when the sample is in the second rotational position, wherein light of different wavelengths within the new multichromatic beam have different corresponding focal lengths;

detecting, by the beam detector separate from the beam emitter, a portion of the new multichromatic beam that is reflected by the surface of the sample when the sample is in the second rotational position;

determining one or more new wavelengths having a highest prevalence in the portion of the new multichromatic beam; and determining a new relative position of the sample in the charged particle device based on the one or more new wavelengths.

B3.3. The method of any of paragraphs B3-B3.2, wherein when the sample is in the first rotational position the surface of the sample is facing a charged particle beam column, and when the sample is in the second rotational position the surface of the sample is facing an additional charged particle beam column.

B4. The method of any of paragraphs B1-B3.3, further comprising modifying a settings/performance of a/the charged particle beam system based on the relative position of the sample.

C1. Use of the confocal chromatic sensor system of any of paragraphs A1-A14.1 to perform any of the methods of paragraphs B1-B4.

What is claimed is:

1. A confocal chromatic sensor system, comprising:
   a beam emitter configured to emit a multichromatic beam to be incident on a surface, wherein light of different wavelengths within the multichromatic beam have different corresponding focal lengths;
   a beam detector separate from the beam emitter that is configured to detect a portion of the multichromatic beam that is reflected by the surface;
   a processing unit; and
   a memory storing computer readable instructions that, when executed on the processing unit cause the processing unit to perform the steps of:
      determining one or more wavelengths having a highest prevalence in the detected portion of the multichromatic beam; and
      determining, based on the one or more wavelengths, a distance between the surface and the beam emitter.

2. The confocal chromatic sensor system of claim 1, wherein the beam emitter comprises: a light source configured to emit the multichromatic beam; and at least one lens having a high degree of chromatic aberration such that, after the multichromatic beam emitted by the light source passes through the at least one lens, the light of different wavelengths within the multichromatic beam have different corresponding focal lengths.

3. The confocal chromatic sensor system of claim 1, wherein the beam detector comprises an optical element configured to receive the portion of the multichromatic beam that is reflected by the surface, and the optical element has a numerical aperture that is less than the sin of the reflection angle between the portion of the multichromatic beam that is reflected and a normal extending from the surface at the point of reflection.

4. The confocal chromatic sensor system of claim 1, wherein the beam detector comprises an optical element configured to receive the portion of the multichromatic beam that is reflected by the surface, and the optical element has an entrance pupil diameter that is less than that is less than twice the focal length multiplied by the sin of the reflection angle between the portion of the multichromatic beam that is reflected and a normal extending from the surface at the point of reflection.

5. The confocal chromatic sensor system of claim 1, wherein the surface is the surface of a sample, and further comprising:
   a sample holder configured to hold the sample; and
   a charged particle beam column configured to cause a charged particle beam to be incident on the surface of the sample, and wherein the instructions are further executable to cause the processing unit to determine a position of the sample in relation to the charged particle beam column.

6. The confocal chromatic sensor system of claim 5, wherein the instructions are further executable to adjust one or more settings of a charged particle beam system associated with the charged particle beam column based on the position of the sample in relation to the charged particle beam column.

7. The confocal chromatic sensor system of claim 5, wherein the beam emitter is positioned on a first side of the charged particle beam column, and the beam detector is positioned on a second side of the charged particle beam column that is different from the first side.

8. The confocal chromatic sensor system of claim 5, further comprising an additional charged particle beam column, and wherein the sample holder is further configured to rotate the sample between a first rotational position where the surface of the sample is facing the charged particle beam column, and a second rotational position where the surface of the sample is facing the additional charged particle beam column.

9. The confocal chromatic sensor system of claim 8, wherein the beam emitter is positioned so that the emitted multichromatic beam is incident on the surface of the sample when the sample is in the first rotational position and when the sample is in the second rotational position, and the system further comprises an additional beam detector, wherein:
the beam detector is positioned to detect the portion of the multichromatic beam that is reflected by the surface when the sample is in the first rotational position; and
the additional beam detector is positioned to detect the portion of the multichromatic beam that is reflected by the surface when the sample is in the second rotational position.

10. The confocal chromatic sensor system of claim 8, wherein the beam emitter is positioned so that the emitted multichromatic beam is incident on the surface of the sample when the sample is in the first rotational position and when the sample is in the second rotational position, and the system further comprises an additional beam emitter, wherein:
the beam emitter is positioned to emit the multichromatic beam that is reflected by the surface when the sample is in the first rotational position; and
the additional beam emitter is positioned to emit an additional multichromatic beam that is reflected by the surface when the sample is in the second rotational position.

11. The confocal chromatic sensor system of claim 5, wherein a receiving optical surface of the beam detector comprises a plurality of optical fibers individually configured to accept light.

12. The confocal chromatic sensor system of claim 5, wherein the beam detector contains a plurality of optical fibers individually configured to accept light, and a receiving optical surface of the beam detector comprises a lens configured to direct light into the plurality of optical fibers.

13. The confocal chromatic sensor system of claim 5, wherein the sample holder is further configured to translate the sample between a first position and a second position, wherein the second position is different than the first position.

14. The confocal chromatic sensor system of claim 13, further comprising a prism configured to refract one of the multichromatic beam and the portion of the multichromatic beam that is reflected by the surface, such that the portion of the multichromatic beam that is reflected by the surface strikes a receiving optical surface of the beam detector when the sample is in the first position and the second position.

15. The confocal chromatic sensor system of claim 14, further comprising an additional prism configured to refract the other of the multichromatic beam and the portion of the multichromatic beam that is reflected by the surface, such that the portion of the multichromatic beam that is reflected by the surface strikes the receiving optical surface of the beam detector when the sample is in the first position and the second position.

16. A method for determining a position of a sample in a charged particle device, comprising:
emitting, by a beam emitter, a multichromatic beam to be incident on a surface of the sample, wherein light of different wavelengths within the multichromatic beam have different corresponding focal lengths;
detecting, by a beam detector separate from the beam emitter, a portion of the multichromatic beam that is reflected by the surface of the sample;
determining one or more wavelengths having a highest prevalence in the portion of the multichromatic beam; and
determining the position of the sample in the charged particle device based on the one or more wavelengths.

17. The method of claim 16, further comprising:
translating, via a sample holder, the sample to a new position relative to the beam emitter;
determining one or more additional wavelengths having a highest prevalence in the portion of the multichromatic beam when the sample is in the new position, wherein the one or more additional wavelengths are different from the one or more wavelengths; and
determining a new position of the sample in the charged particle device based on the one or more additional wavelengths.

18. The method of claim 16, further comprising:
rotating, via a sample holder, the sample between a first rotational position and a second rotational position;
detecting, by an additional beam detector separate from the beam detector and when the sample is in the second rotational position, the portion of the multichromatic beam that is reflected by the surface of the sample;
determining one or more new wavelengths having a highest prevalence in the portion of the multichromatic beam when the sample is in the second rotational position; and
determining a new position of the sample in the charged particle device based on the one or more new wavelengths.

19. The method of claim 16, further comprising:
rotating, via a sample holder, the sample between a first rotational position and a second rotational position;
emitting, via an additional beam emitter, a new multichromatic beam to be incident on the surface of the sample when the sample is in the second rotational position, wherein light of different wavelengths within the new multichromatic beam have different corresponding focal lengths;
detecting, by the beam detector, a portion of the new multichromatic beam that is reflected by the surface of the sample when the sample is in the second rotational position;
determining one or more new wavelengths having a highest prevalence in the portion of the new multichromatic beam; and
determining a new position of the sample in the charged particle device based on the one or more new wavelengths.

20. The method of claim 16, further comprising modifying one or more settings of a charged particle beam system based on the position of the sample.

* * * * *